United States Patent [19]
Pernici et al.

[11] Patent Number: 4,829,266
[45] Date of Patent: May 9, 1989

[54] CMOS POWER OPERATIONAL AMPLIFIER

[75] Inventors: Sergio Pernici, Bergamo; Germano Nicollini, Piacenza, both of Italy; Daniel Senderowicz, Berkeley, Calif.

[73] Assignee: SGS-Thomson Microelectronics S.p.A., Catania, Italy

[21] Appl. No.: 206,016

[22] Filed: Jun. 10, 1988

[30] Foreign Application Priority Data

Jun. 10, 1987 [IT] Italy .................. 83635 A/87

[51] Int. Cl.$^4$ ............................................ H03F 3/45
[52] U.S. Cl. ............................... 330/253; 330/257; 330/260; 330/311
[58] Field of Search ............... 330/253, 255, 257, 260, 330/261, 311

[56] References Cited

U.S. PATENT DOCUMENTS 4,538,114  8/1985  Kunimi et al. ............... 330/253
4,730,168  3/1988  Senderowicz et al. ......... 330/253

Primary Examiner—James B. Mullins
Attorney, Agent, or Firm—Bierman & Muserlian

[57] ABSTRACT

A CMOS power operational amplifier with large output voltage swing and high noise rejection is obtained by coupling a folded cascode type differential input stage and an output stage comprising an intermediate signal shifting amplifier and two common source output stages. Constant current generators inject into the drain of grounded gate MOS transistors pairs of said folded cascode type stage and of said intermediate signal shifting amplifier, respectively, a current which is pulled out of the source of the same grounded gate transistors by other constant current generators for increasing the effective transconductance of said grounded gate transistors pairs.

1 Claim, 4 Drawing Sheets

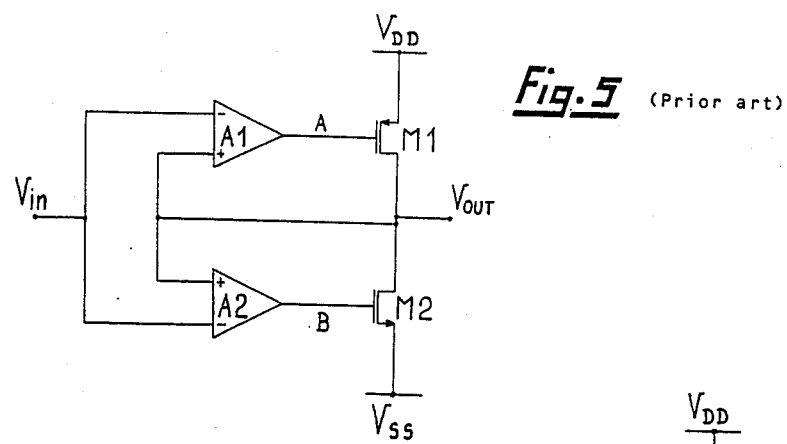
Fig. 5 (Prior art)
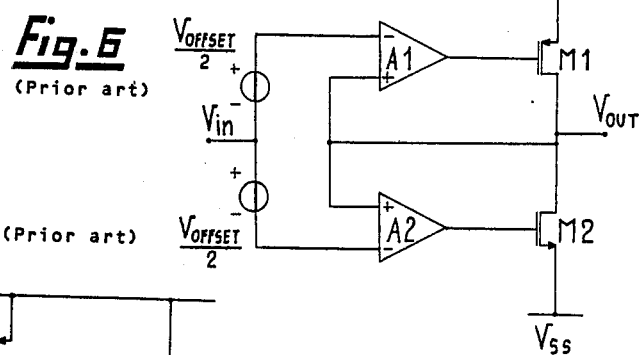
Fig. 6 (Prior art)
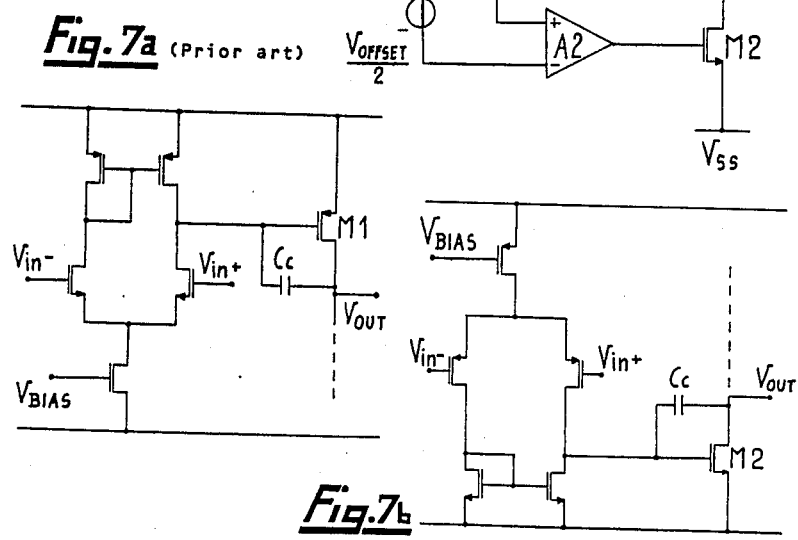
Fig. 7a (Prior art)
Fig. 7b (Prior art)

CMOS POWER OPERATIONAL AMPLIFIER

BACKGROUND OF THE INVENTION

1. Field of the Invention

The integration of complex electronic systems on a single chip often requires the presence of both digital and analog circuits implemented by the same fabrication process. Lately an evolution of digital techniques has permitted an extension of their utilization to implement an ever increasing number of functions (e.g. filtering). However the circuits which allow interfacing a digital system with the real world such as those for analog-digital and digital-analog conversion and for amplification, remain unreplaceable analog type circuits.

In particular at the output of integrated systems an interface circuit capable of providing a correct output signal independently of the load conditions imposed by an external user remains necessary. This kind of interfacing is generally implementing by means of a power operational amplifier. The latter is a circuit capable of driving capacitive (up to several hundreds picofarads) and resistive loads (down to few hundreds ohms). Many integrated circuits, commonly made by means of bipolar technology, performing only this function are commercially available. These integrated devices may be connected in cascade to complex integrated circuits as power interfaces towards the real world. Lately it has been made possible to integrate also these interface circuits in the same integrated circuit containing a certain processing system and achieving a good performance therefrom. Generally the technology utilized for making complex monolithically integrated systems is the so-called MOS (Metal-Oxide-Semiconductor) technology, therefore analog circuits designers are actively engaged in designing MOS power operational amplifiers showing better and better characteristics.

These characteristics may be listed as follows: ability of driving ever more heavier loads with maximum voltage excursions as close as possible to the value of the supply voltages, good rejection of noise coming from supplies, low output impedance, low power dissipation and a small area requirement.

2. Discussion of the Prior Art

A power operational amplifier is commonly formed by two stages (FIG. 1). An input stage which differentially picks up a signal and amplifies it, followed by a power output stage. The first stage is commonly a simple differential amplifier or a "folded cascode" amplifier, notably having a higher gain, (these amplifiers are well known to analog MOS circuits designers and are amply described in the volume "Analog MOS integrated circuits for signal processing", Gregorian Temes). For the second or power output stage various solutions exist and are herein below briefly recalled.

The source follower output stage (FIG. 2) is similar to the well known bipolar emitter follower circuit. The common drain configuration used is characterized by a voltage gain lower than unity, by a wide band and by a high current gain. A disadvantage is the low output dynamic which is limited because the output voltage Vout may raise only to a value equal to Vcc−Vgs, where Vgs is the voltage developed between gate and source which may have a rather high value when the transistor must apply a strong current for driving heavy resistive loads. Moreover the rest power dissipation is rather heavy in so far the transistor acting as a current generator must draw a direct current greater than the maximum current which may be delivered to the load in presence of an input signal.

In order to improve the output voltage swing (dynamic) the output MOS transistor M1 may be replaced by a bipolar transistor (FIG. 3) which may be formed during a basic CMOS fabrication process without any additional processing step. In this case the output voltage may raise up to about Vcc−0.7 (Volts). The problems relative to a high power dissipation under rest conditions and to the necessity of providing a relatively sturdy input stage capable of driving the rather low input impedance of the bipolar transistor output stage (few kilo-ohms instead of few giga-ohms as in the case of a MOS transistor) remain. Moreover bipolar transistors made by a CMOS fabrication process notably have rather poor intrinsic characteristics.

Another output stage is the "push-pull" stage (FIG. 4). This stage operates in class AB; i.e. in the absence of an input signal, M5 and M6 are only slightly conducting and therefore they dissipate a smaller power. The current circulating through the output transistors depends from the signal. A low output dynamic remains a drawback of this solution. The output voltage swing is in fact limited to a volate equal to Vgs from both sides of the supply.

Lately a much utilized output stage is that depicted in FIG. 5. The amplifiers A1 and A2 (called error amplifiers) are provided with feedback from the output to the non-inverting input thereof utilizing the voltage and Vgd existing across the gate and drain of the relative output MOS transistor and they must supply to the output a d.c. voltage having a value such as to provide a correct bias current through the output transistors. From a signal stand point, the two amplifiers behave as unitary gain, noninverting buffers carrying the output signal (i.e. Vout=Vin). If Vin raises the voltage at nodes A and B falls and therefore transistor M1 is capable of providing the whole current needed by the load while transistor M2 may ultimately be switched-off (viceversa if Vin drops). This solution besides requiring two additional error amplifiers is strongly affected by offset. An offset voltage is generated when pairs of transistor which ideally should be identical (such as the the input pair of a differential stage or the transistor pair forming a current mirror) are not identical because of local variations in the fabrication process. Consequently voltages or currents which in theory should be equal are not so thus unbalancing the operation of a certain circuit.

An offset between the two error amplifiers, as depicted in FIG. 6, may change the d.c. driving voltage of M1 and M2 in such a way that the bias current in both transistors becomes very small in one case or increases very much in another case. Variations of up to 10:1 of the power dissipated may so take place and this is often unacceptable. Special control circuits of the output current are needed and this complicates further the overall design.

Moreover an attendant problem to be kept in consideration is the stability of the loop comprising the amplifier A1 and the transistor M1 and of the loop comprising the amplifier A2 and the transistor M2. The cascade of the amplifier (A1 or A2) and of the transistor (M1 or M2) may be considered in fact as a two stages amplifier. It is well known that a two stages amplifier requires one or more compensating capacitors. Without these the phase shift introduced by the two stages in cascade may conduct to oscillation or at the least may cause a step response containing an acceptable damped oscillation. A first compensating method contemplates connecting a capacitor between the output of the power output stage and the output of said first stage. This method is effective, however supply's noise rejection greatly decreases at high frequencies. This fact is immediately appreciated by observing the simplified examples depicted in FIG. 7A (for the cascade A1 and M1) and in 7b (for the cascade A2 and M2), wherein the first or the input stage is a differential stage, the second or output power stage is a common source amplifier and Cc is a compensation capacitor. At the frequency at which the capacitors Cc tend to behave as short circuits, the M1 and M2 transistors become diode-connected and constitute a low impedance path between the output node and the supplies (the transistors being equivalent to resistances of 1/gm value, wherein gm is the transconductance of the MOS transistors). Any noise on the supply is therefore entirely transferred to the output.

A second compensation method capable of diminishing the effect of noise present on the supply has been described in the article "An improved frequency compensation technique for CMOS operational amplifier" by Bhupendra Ahuia, IEEE JSSC, December 1983, and is illustrated in FIG. 8. As known to the skilled technician, at frequencies at which the compensation capacitor Cc behaves as a short circuit the output signal follows the source of transistor Q which in turn is tied to ground, if the transconductance gm thereof is sufficiently large, and therefore is not affected by disturbances on the supply. A disadvantage of this solution is that the two MOS transistors with which the current generators I are made must given exactly the same current notwithstanding one being a P-channel and the other an N-channel transistor (this being rather difficult to obtain), otherwise the offset at the input of the amplifier becomes very large. In fact any unbalance (I) between these two MOS transistors causes the voltage of node A to vary by a quantity V equal to Ra I, where Ra is the total impedance seen from node A. This voltage variation V is converted in an output current variation Iout equal to $gm_{M1}$ V and in turn this output current variation Iout develops a voltage variation Vout equal to Ru Iout, where Rout is the total impedance seen from the output node. By dividing Vout by the input-to-output, open loop gain $gm_{in}Ragm_{M1}Rout$ an input offset voltage equal to $I/gm_{in}$ is generated.

SUMMARY OF THE INVENTION

A main objective of the present invention is to provide an improved CMOS power operational amplifier with a large output voltage swing and a high rejection of high frequency supply's noise without the drawbacks and disadvantages of prior art CMOS power operational amplifiers.

The objective and associated advantages are achieved by the CMOS operational amplifier of the present invention which essentially comprises:

a folded cascode type input differential stage operating to produce a first output signal strongly amplified on a first output terminal thereof and a second weakly amplified output signal on a second output terminal thereof in function of input signals applied to two input terminals of the amplifier and an output stage formed by an intermediate signal shifter amplifier having an inverting and a noninverting input coupled, respectively, to said second and to said first output terminals of said input stage and operating to produce an output signal on an output terminal thereof in function of said output signals of said input stage, and a first common source output amplifier and a second common source output amplifier having a common output node constituting the output node of the power operational amplifier, the first common source output amplifier being driven by said output signal of said intermediate signal shifter amplifier, the second common source output amplifier being driven by the same signal which is applied to the non-inverting input of said intermediate signal shifter amplifier;

said folded cascode type input differential stage comprising at least a P-channel transistor with grounded gate connected respectively in series with each one of two P-channel output transistors of said cascode type differential stage, a drain of said P-channel transistors with grounded gate connected in series constituting, respectively, said first and said second output terminals of the input differential stage;

said intermediate signal shifter amplifier comprising a current mirror formed by a pair of P-channel transistors, wherein on each of the two branches of the current mirror are connected in series a first N-channel transistor with grounded gate and a second N-channel transistor having a gate, constituting one of said inputs of the intermediate signal shifter amplifier, connected to one of said output terminals of said input differential stage, the output terminal of the intermediate signal shifter amplifier being constituted by the drain of the N-channel transistor with grounded gate connected in series to the N-channel transistor whose gate constitutes said inverting input;

a first and a second compensating capacitors connected between said output node of the operational amplifier and, respectively, the source of said N-channel transistor with grounded gate connected in series with the N-channel transistor whose gate constitutes the inverting input of said intermediate signal shifter amplifier and the source of said P-channel transistor with grounded gate whose drain constitutes said first output terminal of the input differential stage;

P-channel constant current generators injecting into the drain of said N-channel transistors with grounded gate of said intermediate signal shifter amplifier a current which is pulled from the source of the same transistors by means of N-channel constant current generators; and N-channel constant current generators injecting into the drain of said P-channel transistors with grounded gate of said folded cascode type input differential stage a current which is pulled from the source of the same transistors by means of P-channel constant current generators.

BRIEF DESCRIPTION OF THE DRAWINGS

FIG. 5 is a circuit diagram of another output power stage utilizing a pair of error amplifiers;

FIG. 6 is the same circuit diagram of FIG. 5 wherein offset voltages are schematically indicated by offset voltage generators;

FIGS. 7a and 7b are circuit diagrams illustrating prior art compensation arrangements for the two parallel loops of the output stage depicted in the preceding FIGS. 5 and 6.

DESCRIPTION OF THE PREFERRED EMBODIMENT

Figure 9:
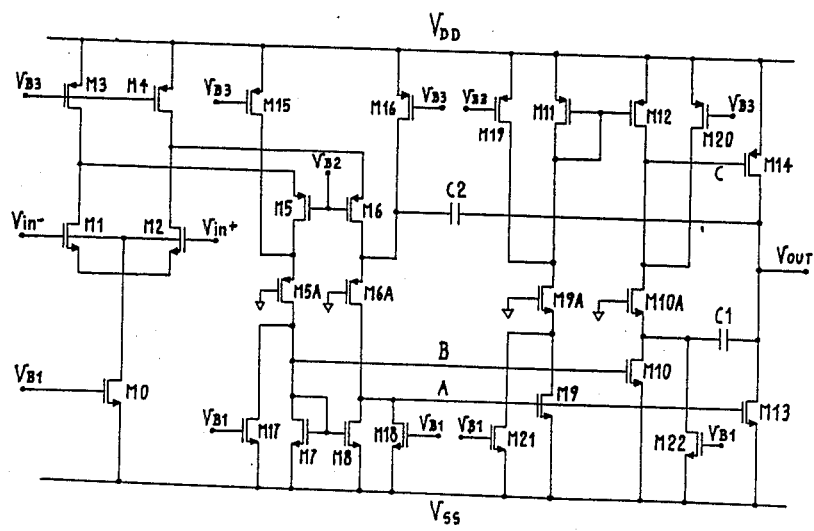
FIG. 9 is a circuit diagram of a power operational amplifier made in accordance with the present invention.

A representative circuit diagram of the power operational amplifier of the invention is shown in FIG. 9.

Figure 10:
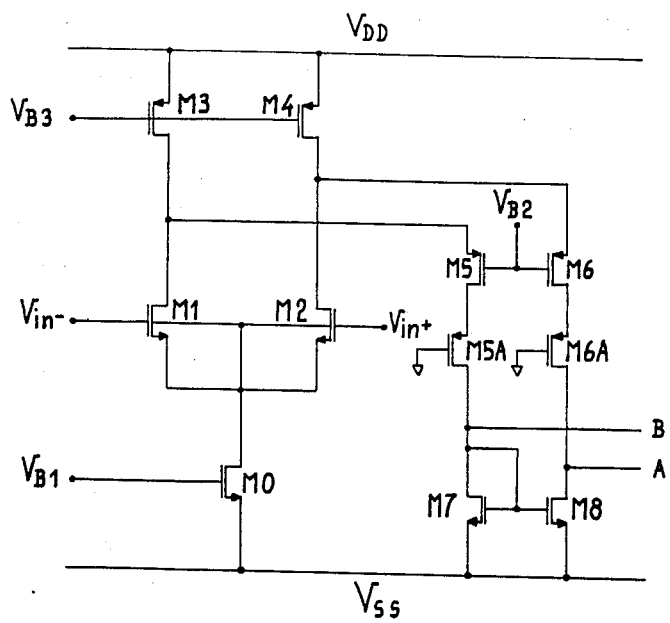
FIG. 10 is an enlarged illustration of the folded cascode type input differential stage of the amplifier of the present invention.
Figure 11:
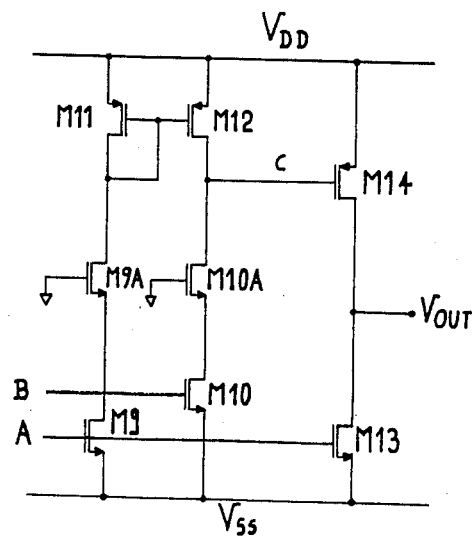
FIG. 11 is a simplified circuit diagram of the output stage of the amplifier of the invention without the compensation means shown in the complete circuit diagram of FIG. 9.

The peculiar aspects of the amplifier of the invention may be represented by the association of a folded cascode type input differential stage, shown separately in FIG. 10, with a peculiar output stage, whose circuit diagram, without the compensating means, is separately shown in FIG. 11.

The input stage of the amplifier is a customary folded cascode type input differential stage. The input differential pair of transistors M1 and M2, the relative bias current generators M0, M3 and M4 are representative of a standard differential input stage having a folded cascode output configuration formed by the transistor pair M5A and M6A, both with grounded gate, by the bias current generators M5 and M6 and by the output current mirror formed by the pair of transistors M7 and M8. $V_{B1}$, $V_{B3}$ and $V_{B2}$ are biasing constant voltages.

The folded cascode type differential input stage operates to produce a strongly amplified signal on a first output terminal A and a weakly amplified output signal on a second output terminal B, in function of signals applied to the two input terminals $V_{in-}eV_{in+}$ of the stage, i.e. of the operational amplifier.

As evidenced in the simplified partial circuit diagram of FIG. 11, the output stage is essentially formed by an intermediate signal shifting amplifier, formed by transistors M9, M9A, M10, M10A, M11 and M13, which under steady conditions supply to the node C a voltage of value such as to produce the correct bias current in the P-channel output transistor M14 (i.e. to a first common source output amplifier). Substantially, from the point of view of signal processing, the intermediate amplifier picks-up from the node B of the circuit corresponding to said second output terminal of the folded cascode type differential input stage the output signal thereof and supplies an amplified replica of such a signal to the node C of the circuit.

The other N-channel output transistor M13 (i.e. the second common source output amplifier) is directly driven on its gate by the signal present at the node A of the circuit (i.e. at said first output terminal of the folded cascode type differential input stage.

In respect to a comparable output stage of the prior art (e.g. FIG. 5), the output stage of the amplifier of the invention is simpler and less burdensome and moreover is capable of limiting to a large extent possible bias current variations in the output transistors which may occur because of differences existing between transistors pairs which ideally should be identical.

Figure 1:
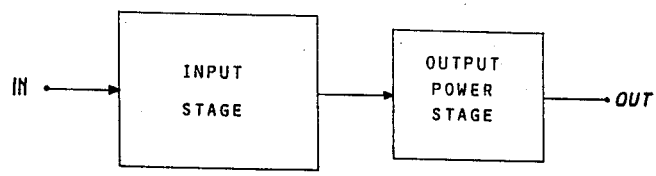
FIG. 1 is a block diagram of a power operational amplifier.
Figure 2:
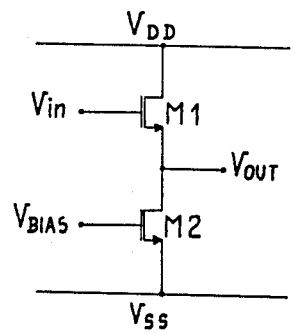
FIG. 2 is a source follower output stage.
Figure 4:
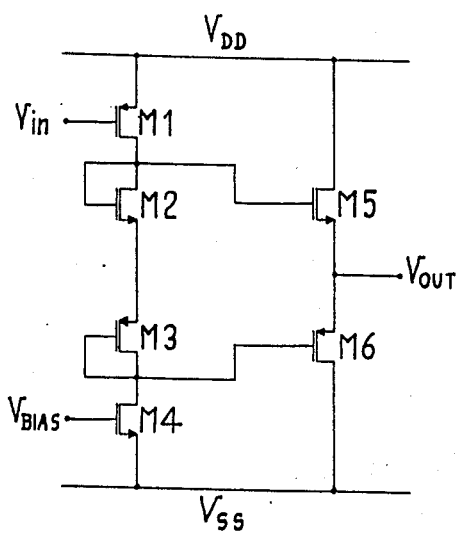
FIG. 4 is a "push-pull" output stage.
Figure 3:
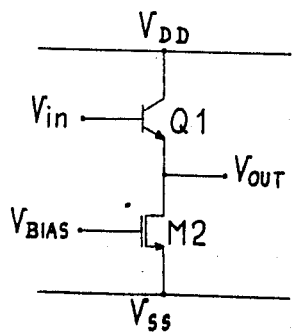
FIG. 3 is a modified power output stage similar to the one depicted in FIG. 2.
Figure 8:
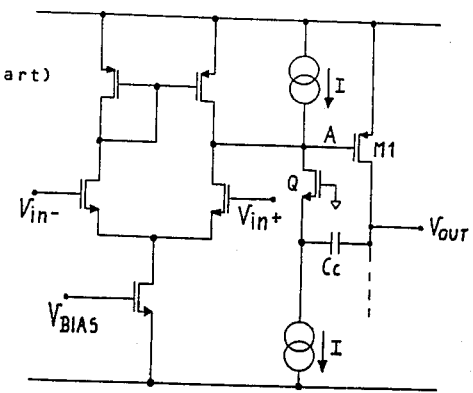
FIG. 8 is a circuit diagram similar to the circuit diagram of FIG. 7a with the addition of circuit means for increasing noise rejection at high frequencies.

The amplifier of the invention permits frequency compensation of the two amplification loops allowing an enhanced rejection of noises present on the supplies while limiting the input offset voltage due to differences between transistors forming pairs of constant current generators as it will become evident through the following description, in contrast with what takes place in the comparable amplifier of the prior art depicted in FIG. 8.

By turning now to the more complete circuit diagram of the amplifier of the invention of FIG. 9, a more detailed analysis of the operation of the amplifier can be made. The transistors M15, M16, M17, M18, M19, M20, M21 and M22 are for implementing compensation of the two amplifying loops and do not affect the basic operation of the amplifier and therefore they may momentarily be ignored. Supposing that an input signal make the voltage at the input terminal $V_{in-}$ raise and the voltage at the input terminal $V_{in+}$ drop, an unbalance of the differential input stage is created. This unbalance reflects in an increased current flow through M8 in respect to the current flowing through M7 snd therefore the unbalance reflects in a strong increase ($V_A$) of the potential of the node A of the circuit (such an increase $V_A$ being equal to $gm_{in}R_A$) and in a slight drop of the potential of the node B of the circuit (such a drop $V_B$ being equal to $gm_{in}/gm_{M7}$). The potential of the gates of transistors M9 and M13 increases and so does the current therethrough. The current flowing through M9 passes unaltered through the transistor with grounded gate M9A and enters the current mirror formed by the pair of transistors M11 and M12. This tends to equate the currents through transistors M11 and M12; however since transistor M10 pulls less current than in the absence of a signal because the gate thereof is at a lower voltage, M10 strongly charges the circuit node C increasing the voltage thereof by an amount $V_C$ equal to $gm_{in}R_Agm_{M9}R_C$. As a consequence the voltage between the gate and the source (Vgs) of transistor M14 drops and so does the current flowing therethrough. An unbalance Iout of the currents through M13 and M14 is thus generated in function of the input signal (Iout being equal to $gm_{M13}V_A+gm_{M14}V_C$). The current flowing through the transistor M13 in excess of the current flowing through M14 flows to the external load determining a decrease of the output voltage given by Rl Iout, where Rl is the output impedance which comprises the external load too.

For an input signal of opposite polarity, the unbalance of the current through M13 and M14 takes place in an opposite sense and M14 supplies to the load the current in excess of the current flowing through M13, thus raising the output voltage.

The input-to-output gain of the output buffer stage is thus extremely high and given by:

$$A_0 = gm_{in}R_A(gm_{M13} + gm_{M9}R_Cgm_{M14})Rl.$$

A main feature of the output stage of the amplifier of the invention resides in the way the two amplification loops are compensated and which has decisive advantages in respect to a comparable arrangement of the prior art described in relation to the circuit diagram of FIG. 7. Compensation is obtained by means of two capacitors C1 and C2 and by means of the two transistors with grounded gate M6A and M10A. The other pair of transistors with grounded gate M5A and M9A are utilized only for summetry considerations. Upon similar considerations to those made for the prior art case depicted in FIG. 7, the above mentioned transistors with grounded gate permit attainment of an output voltage which is insensitive to disturbances on the supplies, also at high frequencies. For this to be possible the above mentioned MOS transistors with grounded gate should possess a high transconductance (gm) value. In accordance with prior art techniques, this would be generally achieved by forming these transistors with a relatively large width.

The solution offered by the present invention is different and more advantageous. It consists in utilizing the constant current generators formed by the transistors M15, M16, M17, M18, M19, M20, M21 and M22, the function of which will be now explained. The P-channel constant current generators inject into the drain of the mentioned MOS transistors with grounded gate a certain current which is pulled out of the source thereof by the N-channel constant current generators. Their function therefore is simply that of locally raising the value of the current flowing through the above mentioned MOS transistors with grounded gate without affecting the currents circulating in the rest of the circuit. Because the transconductance gm of MOS transistors is proportional to the square root of the current flowing therethrough (besides to the width to length ratio of the transistor), the effect of these current generators is therefore that of increasing the transconductance gm of the MOS transistors with grounded gate mentioned above and thus of improving their behaviour in the desired sense mentioned before. By this arrangement it is possible to maintain within acceptable limits the dimensions of the above mentioned MOS transistors with grounded gate, thus ensuring a good performance of the circuit without an excessive occupation of silicon area.

When discussing the prior art solution of FIG. 8, it was noted that a difference of the currents of the constant current generators I sould cause a large offset at the input. The occurrence of such a difference is practically inevitable in view of the fact that one current generator is a P-channel and the other an N-channel.

Conversely in the power operational amplifier of the invention, notwithstanding the fact that there are four P-channel constant current generators M15, M16, M19 and M20 which must compare with four N-channel constant current generators M17, M18, M21 and M22, respectively, it is easily seen that an eventual unbalance of currents between M15 and M17, M16 and M18, M19 and M21, and M20 and M22 has a negligeable effect upon the input offset voltage. On the other hand what is required in the case of the amplifier of the present invention is that no unbalances ($\Delta I$) be present between the constant currents of M15 and M16 and of M17 and M18 (differences between currents of M19 and M20 and M21 and M22 being far less critical as well understood by the skilled technician). Such unbalances would cause an input offset equal ti $I/gm_{in}$. However because the two pairs of transistors M15 and M16, M17 and M18 are formed by MOS transistors of the same type of channel polarity, respectively, it is far more easier to ensure that these pairs of transistors have equal currents or in any case that any current difference I be very small and therefore also the input offset. Another advantageous aspect of the amplifier of the present invention is that, differently from comparable prior art circuits (FIG. 6), an auxiliary circuit for controlling the output current is no longer necessary because such a control is intrinsically performed by the circuit of the amplifier of the invention depicted in FIG. 9.

By examining the possible offsets among pairs of transistors which should nominally be identical, a skilled techician will recognize that these eventual offsets will always determine an unbalance of steady currents through the two output transistors such that one of the two currents increases while the other decreases. The excess current flowing through one of the two output transistors tends to flow through the load thus causing a variation of the output voltage. Since the operational amplifier is provided with feedback, during normal operation, a tendency of the output volage to vary is sensed at the input of the amplifier and the amplifier reacts by unbalancing the differential input pair of transistors in a sense as to counter-balance the variation tendency of the output voltage. The differential input voltage necessary for counterbalancing a certain variation of the output voltage is equal to the latter divided by the open loop gain of the amplifier and therefore is extremely low because such a gain is very high. In the end equality between the two currents flowing through the two output transistors at a value close to a nominal value is re-established and a limited offset voltage, contained within tolerable limits, develops across the input terminals of the amplifier. In case of comparable prior art circuit such as the one depicted in FIG. 6, there might be offsets among transistor pairs which produce strong variations in the same sense of the currents flowing through the output transistors with the consequence that the voltage at the output does not tend to vary and therefore the feedback cannot intervene. In these cases additional auxiliary circuits are necessary for detecting an eventual increase in the same sense of the currents flowing through the two output transistors and for counteracting these increases. These additional circuits and other nonideal elements which make even more critical the design of the amplifier.

We claim:

1. A CMOS power operational amplifier with a large output voltage swing and a high noise rejection, characterized by comprising a folded cascode type input differential stage operating to produce a first output signal strongly amplified on a first output terminal thereof and a second weakly amplified output signal on a second output terminal thereof as a function of input signals applied to two input terminals of the amplifier;

an output stage formed by an intermediate signal shifter amplifier having an inverting and a noninverting input coupled, respectively, to said second and to said first output terminals of said input stage and operating to produce an output signal on an output terminal thereof as a function of said output signals of said input stage, and a first common source output amplifier and a second common source output amplifier having a common output node constituting the output node of the operational amplifier, the first common source output amplifier being driven by said output signal of said intermediate signal shifter amplifier, the second common source output amplifier being driven by the same signal which is applied to the non-inverting input of said intermediate signal shifter amplifier;

said folded cascode type input differential stage comprising at least a P-channel transistor with grounded gate connected respectively in series with each one of two P-channel output transistors of said cascode type differential stage, a drain of said P-channel transistors with grounded gate connected in series constituting, respectively, said first and said second output terminals of the input differential stage;

said intermediate signal shifter amplifier comprising a current mirror formed by a pair of P-channel transistors, wherein in each of the two branches of the current mirror are connected in series a first N-channel transistor with grounded gate and a second N-channel transistor having a gate, constituting one of said inputs of the intermediate signal shifter amplifier, connected to one of said output terminals of said input differential stage, the output terminal of the intermediate signal shifter amplifier being constituted by the drain of the N-channel transistor with grounded gate connected in series to the N-channel transistor whose gate constitutes said inverting input;

a first and a second compensating capacitors connected between said output node od the operational amplifier and, respectively, the source of said N-channel transistor with grounded gate connected in series with the N-channel transistor whose gate constitutes the inverting input of said intermediate signal shifter amplifier and the source of said P-channel transistor with grounded gate whose drain constitutes said first output terminal of the input differential stage;

P-channel constant current generators injecting into the drain of said N-channel transistors with grounded gate of said intermediate signal shifter amplifier a current which is pulled from the source of the same transistors by means of N-channel constant current generators; and N-channel constant current generators injecting into the drain of said P-channel transistors with grounded gate of said folded cascode type input differential stage a current which is pulled from the source of the same transistors by means of P-channel constant current generators.

* * * * *